United States Patent [19]

Anthony et al.

[11] 4,068,814

[45] Jan. 17, 1978

[54] SEMICONDUCTOR BODY HOLDER

[75] Inventors: Thomas R. Anthony; Harvey E. Cline, both of Schenectady, N.Y.

[73] Assignee: General Electric Company, Schenectady, N.Y.

[21] Appl. No.: 733,237

[22] Filed: Oct. 18, 1976

[51] Int. Cl.$^2$ .................. B01J 17/12; B01J 17/02
[52] U.S. Cl. .................. 248/176; 156/616 R; 156/DIG. 73; 156/620; 156/605; 108/150; 118/503; 23/273 SP
[58] Field of Search .............. 248/346, 350, 488, 176, 248/490, 156, 153, 188.7, 188.1, 431; 148/189, 1.5; 118/500, 503, 502, 501; 23/292, 273 SP; 108/150; 156/616, 620, 605 DIG. 73

[56] References Cited

U.S. PATENT DOCUMENTS

| | | | |
|---|---|---|---|
| 1,281,762 | 10/1918 | Carpenter | 118/503 |
| 2,058,128 | 10/1936 | Brubach | 118/503 |
| 2,701,701 | 2/1955 | Wolff | 248/156 |
| 3,226,254 | 12/1965 | Reuschel | 118/503 |

FOREIGN PATENT DOCUMENTS 770,992  9/1934  France ................ 248/156

*Primary Examiner*—Stephen J. Emery
*Attorney, Agent, or Firm*—Donald M. Winegar; Joseph T. Cohen; Jerome C. Squillaro

[57] ABSTRACT

A semiconductor body holder includes a rigid refractory base having a plurality of flexible refractory arms extending from one end thereof. Each arm includes a finger extending therefrom, the fingers in cooperation with the arms, serving to resiliently hold a body of semiconductor material during processing. The holder of the present invention is particularly useful in the practice of temperature gradient zone melting on the semiconductor body.

1 Claim, 3 Drawing Figures

U.S. Patent
Jan. 17, 1978
4,068,814
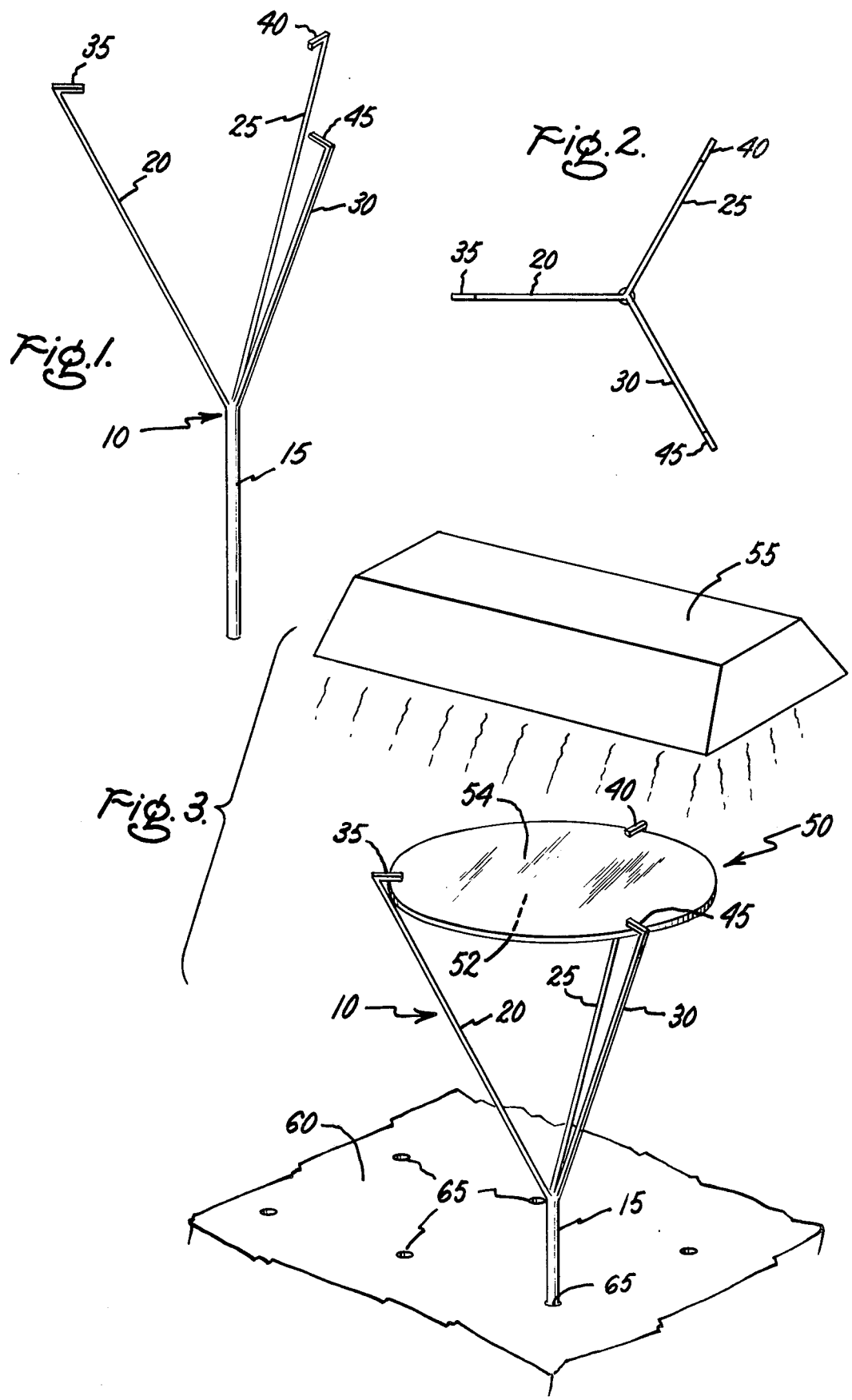

SEMICONDUCTOR BODY HOLDER

BACKGROUND OF THE INVENTION

1. Field of the Invention

This invention relates generally to semiconductor body holders and more particularly to semiconductor body holders useful in the practice of temperature gradient zone melting.

2. Description of the Prior Art

In the manufacture of a semiconductor device, it is often necessary to alter or tailor the conductivity type of a body of semiconductor material. This alteration is achieved by distributing atoms of a conductivity modifying dopant in a selected region or selected regions of the body. Frequently, techniques employed to achieve that distribution require the heating of the semiconductor body.

Recently, it has been discovered that a preferred technique of altering the conductivity of the semiconductor body in a variety of applications is the technique of temperature gradient zone melting. Early teachings of temperature gradient zone melting are found in U.S. Pat. No. 2,813,048 issued to W. G. Pfann, and in a book by Pfann entitled *Zone Melting* (John Wiley & Sons, Inc., 1966). More recent applications of temperature gradient zone melting are disclosed and claimed in U.S. Pat. Nos. 3,899,361 and 3,899,362 to Thomas R. Anthony and Harvey E. Cline and assigned to the assignee of the present invention. The aforementioned U.S. patents to Anthony and Cline are incorporated herein by reference.

As taught in the aforementioned book by Pfann, temperature gradient zone melting involves the migration of a melt of a first material through a body of a second material under the influence of a temperature gradient maintained across the second material and finally a recrystallization of the melt after migration. In the application of temperature gradient zone melting to the production of semiconductor devices, the first material usually comprises a metal such as aluminum, tin-aluminum alloy or gold-antimony alloy while the second material comprises a semiconductor material such as silicon, germanium or the like.

Critical to the successful implementation of temperature gradient zone melting in the manufacture of semiconductor devices is the maintenance of a unidirectional temperature gradient across the semiconductor material. That is, for any desired direction of migration of the conductivity altering dopant through a body or wafer of semiconductor material, a temperature gradient across the body of semiconductor material must be established in exactly the same direction. Presently, in the production of semiconductor devices by temperature gradient zone melting, this preferred direction of migration and thus of the required temperature gradient is normal to the major surfaces of the body or wafer. The existence of temperature gradients in any other directions (lateral or oblique to the major surfaces of the wafer) will cause the migration of the conductivity altering material in these other directions thereby causing the resulting doped zone to be irregular or misdirected and thus adversely affecting the performance of the device.

It has been discovered that the intensity and orientation of the desired temperature gradient can be enhanced by the provision of a heat sink or cooling block on a side of the semiconductor body opposite that which is heated. Due to the possible bowing of the semiconductor body during heating, it is undesirable to place the semiconductor body in contact with the heat sink during the temperature gradient zone melting. Such a bowing would cause only partial contact between the semiconductor body and the heat sink thereby giving rise to undesirable lateral or transverse temperature gradients.

In his copending U.S. patent application Ser. No. 578,736, filed May 19, 1975 and entitled "Heating Apparatus For Temperature Gradient Zone Melting", incorporated herein by reference, John Boah discloses and claims various constructions for semiconductor body supports or holders which in cooperation with the weight of the body, support the body a slight distance above a heat sink thereby avoiding contact between the semiconductor body and the heat sink while eliminating any lateral temperature gradients stemming from that contact. However, such supports which rely on the weight of the semiconductor body for the support of the body are useful only in apparatus where the body is heated from above and where the heat sink is disposed below the body. As the art of temperature gradient zone melting progresses, the heating of the bodies from various other locations relative to the body will be required. Morever, modern techniques of temperature gradient zone melting require that the semiconductor body being treated undergo certain movement while being heated to insure the uniformity of orientation and intensity of the temperature gradient. Such a teaching is found in U.S. patent application Ser. No. 645,675, filed Dec. 31, 1975, in the names of Thomas R. Anthony and Harvey E. Cline and assigned to the assignee of the present invention. This application is incorporated herein by reference. With such a movement of the semiconductor bodies while being treated, the bodies may slide off the supports upon which they rest, damaging the body and causing the misdirection of the desired temperature gradient.

However, it must be appreciated that not all means of positively holding a semiconductor body during processing by temperature gradient zone melting will be suitable. During the heating of the body, the body will radiatively emit heat to the heat sink thereby maintaining the temperature gradient across the body. Any support or holder disposed between the semiconductor body and the heat sink will necessarily block or shadow some of this radiation causing the formation of undesirable lateral or transverse temperature gradients. Furthermore, conduction of heat from the semiconductor body to the holder or support through the contacting surfaces of these two members will cause the formation of cool spots on the semiconductor body thereby distrubing the desired temperature gradient.

It is therefore an object of the present invention to provide a new and improved semiconductor body holder which overcomes the deficiencies of the prior art.

It is another object of the present invention to provide a semiconductor body holder which allows a semiconductor body to be supported in any orientation relative to a source of heat for heating the body.

It is another object of the present invention to provide a semiconductor body holder which adequately supports a semiconductor body while the body is being moved during processing.

It is another object of the present invention to provide a semiconductor body holder which minimizes the blocking of radiation emitted by the semiconductor body to a heat sink.

It is another object of the present invention to provide a semiconductor body holder which minimizes the conduction of heat away from the semiconductor body through the holder.

SUMMARY OF THE INVENTION

These and other objects apparent from the following detailed description taken in connection with the appended claims and accompanying drawings are attained by providing a semiconductor body holder with a rigid refractory base having a plurality of flexible refractory arms extending from one end thereof. Each arm includes a finger extending therefrom, the fingers in cooperation with the arms serving to resiliently hold a body of semiconductor material during processing. The holder of the present invention is particularly useful for holding a semiconductor body during temperature gradient zone melting.

BRIEF DESCRIPTION OF THE DRAWINGS

FIG. 1 is a three-dimensional view of the semiconductor body holder of the present invention.

FIG. 2 is a top view of the semiconductor body holder of the present invention.

FIG. 3 is a three-dimensional view of a semiconductor body held by the semiconductor body holder of the present invention.

DESCRIPTION OF THE PREFERRED EMBODIMENT

Referring to FIGS. 1-3 there are shown a semiconductor body holder 10 including a rigid refractory base 15 and three resilient refractory arms 20, 25 and 30. Arms 20, 25 and 30 are fixed at proximal ends to base 15. Each of arms 20, 25 and 30 includes a projection or finger 35, 40 and 45 respectively extending from a distal end thereof. Arms 20, 25 and 30 are angularly spaced 120° apart. In order to withstand the high temperature (1000°-3000° C) encountered in processing semiconductor bodies as by temperature gradient zone melting, holder 10 is manufactured from a refractory material. It has been found that quartz is particularly suitable for this application, possessing the ability to withstand such high temperatures. Moreover, drawn quartz members employed in the holder of the present invention are of sufficient stiffness to firmly hold a semiconductor body in a manner to be described while being flexible enough to provide an ease of insertion of the body into the holder. In a holder constructed from quartz, base 15 comprises a rigid quartz rod and arms 20, 25 and 30 comprise drawn quartz members fixed to base 15 as by fusion or other suitable techniques. Likewise, fingers 35, 40 and 45 comprise drawn quartz members fixed to arms 20, 25 and 30 as by fusion or similar techniques.

Referring to FIG. 3, there is shown holder 10 positively supporting a semiconductor body or wafer 50 including major surfaces 52 and 54 between a heat source 55 and a heat sink 60. Heat sink 60 is apperterured at a plurality of locations 65 within which base 15 is receivable for support. Arms 20, 25 and 30 are so spaced and are of sufficient resilience to apply equal pressure to the edge of body 50 so as to effectively restrain body 50 in a horizonal direction. The resilience of arms 20, 25 and 30 and the angle these arms make with the central axis of base 15 and semiconductor body 50 cause these arms to urge body 50 upwardly against fingers 35, 40 and 45 which restrain the body in a vertical direction. While semiconductor body 50 is shown being heated from above, it will be appreciated that the positive restraint or clamping provided by resilient arms 20, 25 and 30 and fingers 35, 40 and 45 enable wafer 50 to be firmly held in any orientation thereby allowing the wafer to be heated from any direction such as from below. Should wafer 50 be heated from below, heat sink 60 will be disposed above the wafer and suitable support such as a clamp will be necessary to fix holder 10 to the heat sink.

The relative disposition of the arms and fingers and the thinness of these members allow body 50 to be firmly held with only a minimal amount of contact with the holder. Fingers 35, 40 and 45 contact only the outermost periphery of surface 54 while arms 20, 25 and 30 contact only an edge of the body. Therefore, lateral or transverse temperature gradients due to conduction of heat from body 50 through the fingers and arms is minimized thereby enhancing the desired temperature gradient which ideally is directed parallel to the axis of the body. These lateral gradients are further minimized due to the low thermal conductivity of quartz from which holder 50 in the preferred embodiment thereof is constructed.

It has been discovered that when semiconductor wafer 50 is heated, the wafer will radiate heat to heat sink 60. The amount of this radiation which is blocked or shadowed should be minimized to avoid the creation of cool spots on the wafer which result in transverse temperature gradients. The thinness of arms 20, 25 and 30 minimizes the shadowing effect of these members. Furthermore, the spacing of arms from a substantial portion of surface 52 contributes to the minimization of this shadowing. Of course, this spacing depends on the angle between the arms and base 15. Ideally, to completely avoid any blocking of radiation emitted by body 50 this angle should approach 180°. However, it has been found that the blocking of this radiation is insignificant when the arms are oriented at an angle of approximately 150° from base 15 in a holder for supporting a semiconductor wafer 2 inches in diameter.

Therefore, it will be appreciated that the semiconductor body holder of the present invention provides a means of supporting a body of semiconductor material in any orientation for processing as by temperature gradient zone melting. The structure of the holder and the material employed therein substantially eliminate any undesirable conduction of heat from the body through the holder. The relative disposition of the arms of the holder from the semiconductor body and the heat sink minimizes any shadowing effect of the arms upon radiation emitted by the body.

While there has been shown and described a specific embodiment of the semiconductor body holder of the present invention, it will be apparent to those skilled in the art that modifications may be made without departing from the substance of this invention and it is intended by the appended claims to cover such modifications as come within the spirit and scope of this invention. Although the semi-conductor body member of the present invention has been described as being made from a refractory material such as quartz, it will be understood that the term refractory is used broadly to describe any material resistant to heat and would therefore include materials such as metals or ceramics characterized by this resistance.

What is claimed is:

1. A semiconductor body holder comprising:
   a base comprising a rigid refractory member comprising a quartz rod and having first and second ends, said first end being adapted to support said holder and
   three flexible refractory arms, of quartz each of said arms including distal and proximal ends, the proximal end of each arm being fixed to said second end of said base, said arms forming an obtuse angle of quartz with said base and each of said arms including a refractory finger fixed to the distal end thereof, each of said fingers extending generally toward the central axis of said base, the orientation of said fingers, said arms and said base with each other minimizing any shadowing effect of the arms upon radiation emitted by a wafer supported by the holder as well as minimizing the inducement of undesirable thermal gradients in said wafer, each of said fingers being capable of engaging only a minimal outermost peripheral surface area of a wafer and each arm being capable of only contacting a minimal portion of an edge of a wafer.

* * * * *